(12) United States Patent
Jiang et al.

(10) Patent No.: US 7,993,535 B2
(45) Date of Patent: Aug. 9, 2011

(54) ROBUST SELF-ALIGNED PROCESS FOR SUB-65NM CURRENT-PERPENDICULAR JUNCTION PILLARS

(75) Inventors: Xin Jiang, Mountain View, CA (US); Stuart Stephen Papworth Parkin, San Jose, CA (US); Jonathan Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 854 days.

(21) Appl. No.: 11/627,824

(22) Filed: Jan. 26, 2007

(65) Prior Publication Data

US 2010/0330707 A1   Dec. 30, 2010

(51) Int. Cl.
| | |
|---|---|
| *H01B 13/00* | (2006.01) |
| *C03C 15/00* | (2006.01) |
| *C03C 25/68* | (2006.01) |
| *C23F 1/00* | (2006.01) |
| *B44C 1/22* | (2006.01) |
| *H01L 21/302* | (2006.01) |
| *H01L 21/461* | (2006.01) |

(52) U.S. Cl. ............. 216/17; 216/72; 216/58; 438/689; 438/706; 438/737

(58) Field of Classification Search ........................ None
See application file for complete search history.

(56) References Cited

U.S. PATENT DOCUMENTS

| | | | | |
|---|---|---|---|---|
| 6,097,579 | A * | 8/2000 | Gill | 360/324.2 |
| 6,455,943 | B1 * | 9/2002 | Sheu et al. | 257/786 |
| 6,700,147 | B1 * | 3/2004 | Saigoh | 257/295 |
| 6,861,177 | B2 | 3/2005 | Pinarbasi et al. | |
| 6,965,138 | B2 | 11/2005 | Nakajima et al. | |
| 2002/0011460 | A1 * | 1/2002 | Seigler et al. | 216/22 |
| 2003/0080084 | A1 * | 5/2003 | Kamijima et al. | 216/2 |
| 2005/0269288 | A1 | 12/2005 | Cyrille et al. | |
| 2006/0043280 | A1 * | 3/2006 | Feldbaum et al. | 250/282 |

OTHER PUBLICATIONS

Barros et al, Ion Milling Properties of Laterally Emitting Thin Film Elextroluminescent Materials, May 2001, IEE Transactions of Semicondutor Manufacturing, vol. 14 No. 2, pp. 173-176.*
Brido et al, Thin Multilayers Characterization by Grazing X-Ray Reflectometry and Use of Fourier Transform, Jul. 2006, Applied Surface Science, vol. 253, pp. 12-16.*
Vasile et al, Focused Ion Beam Milling: Depth Control for Three Dimensional Microfabrication, Nov./Dec. 2007, Journal of Vacuum Science and Technology, vol. 15 No. 6, pp. 2350-2354.*
Yamauchi et al, A Pattern Edge Profile Simulation for Obliqe Ion Milling, Oct./Dec. 1984, Journal of Vacuum Science and Technology, vol. 2 No. 4, pp. 1552-1557.*

* cited by examiner

*Primary Examiner* — Nadine G Norton
*Assistant Examiner* — Stephanie Duclair
(74) *Attorney, Agent, or Firm* — F. Chau & Associates LLC; Stephen C. Kaufman, Esq.

(57) ABSTRACT

A method for fabricating a device includes forming a first insulation layer to cover a removable mask and a device structure that has been defined by the mask. The device structure is below the mask. The mask is lifted off to expose a top portion of the device structure. A conductive island structure is formed over the first insulation layer and the exposed top portion of the device structure. The first insulation layer and the conductive island structure are covered with a second insulation layer. A contact is formed through the second insulation layer to the conductive island structure.

18 Claims, 5 Drawing Sheets

ROBUST SELF-ALIGNED PROCESS FOR SUB-65NM CURRENT-PERPENDICULAR JUNCTION PILLARS

BACKGROUND OF THE INVENTION

1. Technical Field

The present disclosure relates to a sub-65 nm process and, more specifically, to a robust self-aligned process for sub-65 nm current-perpendicular junction pillars.

2. Discussion of the Related Art

Patterning of pillar-shaped structures supporting current-perpendicular-to-thin-film-plane (current-perpendicular) transport, such as spin-valves or magnetic tunnel junction devices, in the sub-65 nm range presents several challenges. For magnetic structures in particular, the materials being patterned may be resistant to mature, high-yield, semiconductor-industry-standard etching techniques such as reactive plasma ion etch. Examples of such materials include nickel (Ni), iron (Fe) and cobalt (Co). For such materials, common approaches now make use of ion beam etching (ion milling), which is prone to materials redeposition along the side walls of the device structure features and related resist and/or mask structures.

More generally, formation of pillar-shaped device structures in sub-65 nm dimension would require either a self-aligned insulation opening process or a separate etch-back-based insulation layer opening process.

Conventional self-aligned insulation opening techniques generally favor tall pillar height (>100 nm, for example) and often favor thick insulator layer for process margin controls. Commonly used self-aligned insulation opening techniques include insulator layer planarization and lift-off. An insulator layer planarization process requires the device structure to be sufficiently tall (for example >100 nm) so as to give enough margin for insulation layer etch stop. Electrical integrity of the insulation would also require a relatively thick insulation layer presence after planarization.

In lift-off process, a relatively tall and laterally narrow sacrificial mask structure is formed, for example using a negative electron beam, resist (NEB). The mask is first used for etching to form the desired device structure. After subsequent coating of an insulator layer, the mask may then be removed, for example, by the use of chemical solvents and physical abrasion such as surface polishing. The result of lift-off is a desired contact hole in the insulator layer.

The lift-off process would also favor a tail sacrificial mask which should foe of similar height or taller than the desired insulator layer thickness. This ensures reliable removal of the sacrificial mask structure after insulation deposition.

In both cases, the mask and/or device structure height is dictated toy the process margin relating to the insulator layer thickness and not the lateral size of the device structure pillar being fabricated. As the lateral size of the device structure pillars shrink to well below 65 nm, this becomes increasingly difficult to engineer, as the lateral dimension of the device structure pillar becomes now much less than its height, or the height of the mask structure.

Alternatively, a separate etch-back-based insulator film opening step may be employed. The etch-back-based insulation opening process would require layer-to-layer-registration accuracies well below the feature size, which in this case means repeated use of expensive high precision slow through-put lithography tools such as an electron-beam writer.

Market pressures on high-technology devices such as integrated circuit and magnetic media fabrication require new technologies offering reduced feature size at a reduced cost. Accordingly, advanced fabrication techniques are desired that can produce features in the sub-65 nm range while minimizing the use of expensive processing steps such as electron beam exposure.

In particular, patterning sub-65 nm current-perpendicular junction devices, for example, magnetic tunnel junctions (MTJ) presents a lithographic challenge due to the lack of ideal volatile chemistry for reliable reactive plasma etching of magnetic materials. Approaches commonly use ion beam etching or ion milling to create the desired patterns. In ion beam etching, a bombardment of inert ions may be used to abrade the surfaces of a material to achieve desired features. Unlike other etch techniques such as in reactive plasma etch where removed materials form volatile gas that may foe pumped away, material removed by ion beam etching remains non-volatile and hence, has a tendency to re-deposit, especially along the sidewalls of the device structure being etched, related resist and/or mask structures. This re-deposition may lead to numerous processing quality control issues such as inter-layer electrical shorting, parasitic magnetic coupling and uncontrolled modification of magnetic boundary conditions.

FIG. 1 shows a sketch illustrating side-wall geometry of a current-perpendicular pillar device structure. Side-wall coating can prove detrimental to the quality of top level electrode contact definition and can interfere with lift-off processing.

The illustration of FIG. 1 shows the effects of sidewall re-deposition. Here, visible sidewalls 24 surround the structure of the device structure pillar. Example device structures of a magnetic tunnel junction include an electrically conducting substrate layer 20, a magnetically fixed layer 21, for example, comprising iron and/or iron-cobalt that is magnetically pinned by an antiferromagnetic layer that could either be part of layer 21 or 20; a magnetic tunnel barrier layer 22, for example, comprising aluminum oxide or magnesium oxide, and a ferromagnetic free layer 23, for example, comprising iron and/or iron-cobalt. The area of the electrically conducting substrate layer 20 that is not covered by the device structure 21-23 forms an exposed surface layer.

One proposed solution to the problem of side-wall coating is to carefully engineer the etch-mask side-wall geometry so as to provide controlled side-wall etch profiles that minimise re-deposition during primary etching. Subsequent ion milling may then be applied at various angles to clean up re-deposition. An example of this approach may be seen in U.S. Pat. No. 6,965,138 which is incorporated by reference herein.

Another proposed solution to the problem of side-wall coating is to develop a careful combination of ion beam incident angles and energies during ion milling. However, this approach is highly dependent on the given feature size and material combination and accordingly, the approach must foe optimised, for each particular application. An example of this approach may be seen in U.S. Patent Application Publication No. 2005/0269238 which is incorporated by reference herein.

However, these methods for controlling side-wall geometry are not easily scalable as mask thickness must be scaled along with lateral feature size. Accomplishing this may foe inconvenient or impractical. Moreover, as the junction feature size is reduced to below the thickness of the mask layer, the ability to control side-wall geometry using these conventional approaches suffers further with the optimum combination of ion mill energy and angles depending on the sensitivity of the materials to be milled and the height and side-wall profile geometry of the mask being used. Accordingly, the search for optimal ion mill conditions may be tedious, may not be easily scalable, may not be easily transferable between different ion mill tools and may not be easily transferable between different materials systems.

Another approach relates to the use of thin hard masks such as diamond-like-carbon (DLC) in combination with a shallow depth ion mill etch. The thin mask layer may reduce the build-up of side-wall re-deposition around the mask layer that could interfere with top level insulator and electrode definition. The thin mask may also facilitate the control of a side wall profile of an etched device structure pillar. This approach relies on a substantial etch rate differential between DLC and common magnetic metal such as Co and Ni in the energy range of approximately 200 eV to approximately 500 eV. This approach may be useful in mitigating problems associated with side-wall profile control and related re-deposition problems. However, this approach generally requires the formation of a separate insulator via openings step or a chemical, mechanical polish or other forms of insulator layer planarization steps. As discussed earlier, these options become increasingly undesirable or impractical as the lateral size of the device structure pillar shrinks below 65 nm or the preferred insulation layer thickness. The formation of the separate insulator via openings requires layer overlay accuracy substantially finer than the minimum feature size. This may be executed using multiple levels of electron-beam lithography which is complex, inefficient and costly. Self-aligned top electrode opening based on planarisation requires sizable device structure junction pillar height to provide an adequate margin for insulator layer etch stop, which could diminish the advantage of a thin mask.

SUMMARY OF THE INVENTION

A method for fabricating a device includes forming a first insulation layer to cover a removable mask and a device structure that has been defined by the mask. The device structure is below the mask. The mask is lifted off to expose a top portion of the device structure. A conductive island structure is formed over the first insulation layer and the exposed top portion of the device structure. The first insulation layer and the conductive island structure are covered with a second insulation layer. A contact is formed through the second insulation layer to the conductive island structure.

A method for removing material, having been re-deposited during an ion milling, from a sidewall of a device structure and/or mask structure includes performing gazing angle ion milling at a grazing angle. The grazing angle is selected by determining when a rotation angle-averaged milling rate of the sidewall of the device structure for the grazing angle ion milling at a given gracing angle is larger than an ion milling rate of a thin film stack of the device structure for the given grazing angle.

A method for fabricating a device includes forming a removable mask over a thin film stack. Substantially vertical ion milling is performed to define a device structure under the mask. Grazing angle ion milling is performed to remove material that has been re-deposited along one or more sidewalls of the mask and device structure. A first insulation layer is formed to cover the mask and device structure. The mask is lifted off to expose a top portion of the device structure. A conductive island structure in electrical contact with the exposed top portion of the device structure is formed over the first insulation layer. The first insulation layer and the conductive island structure are coated with a second insulation layer that is thicker than the first insulation layer.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

Figure 1:
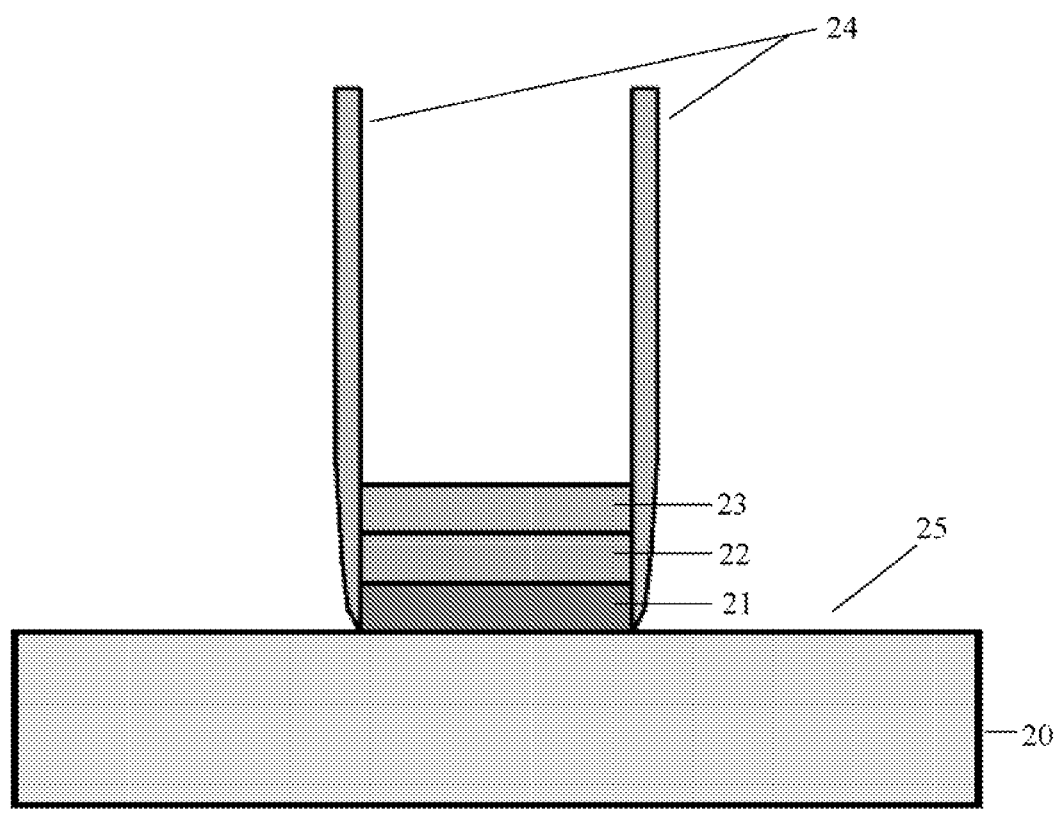
FIG. 1 shows a sketch illustrating side-wall geometry of a structure exhibiting re-deposition.

In describing the exemplary embodiments of the present disclosure illustrated in the drawings, specific terminology is employed for the sake of clarity. However, the present disclosure is not intended to be limited to the specific terminology so selected, and it is to be understood that each specific element includes all technical equivalents which operate in a similar manner.

Lithography Process

Exemplary embodiments of the present invention provide a robust lithography process for ion milling patterns of sub-65 nm current-perpendicular junction device structure comprising magnetic electrodes. This lithography process may be performed while minimising the use of electron beam lithography, which is complex, inefficient and costly. According to some exemplary embodiments, only a single pass of electron beam lithography is used. Moreover, the process may utilize self-aligned via openings and accordingly need not have critical requirements on feature alignment. Self-aligned via openings may be forced more simply without the need for performing a separate registration step. This is because the structure for the device and insulator opening are formed using the very same removable mask layer. Side-wall coating and other difficulties associated with ion milling may be minimized. The process is robust against minor parametric variations.

Figure 2:
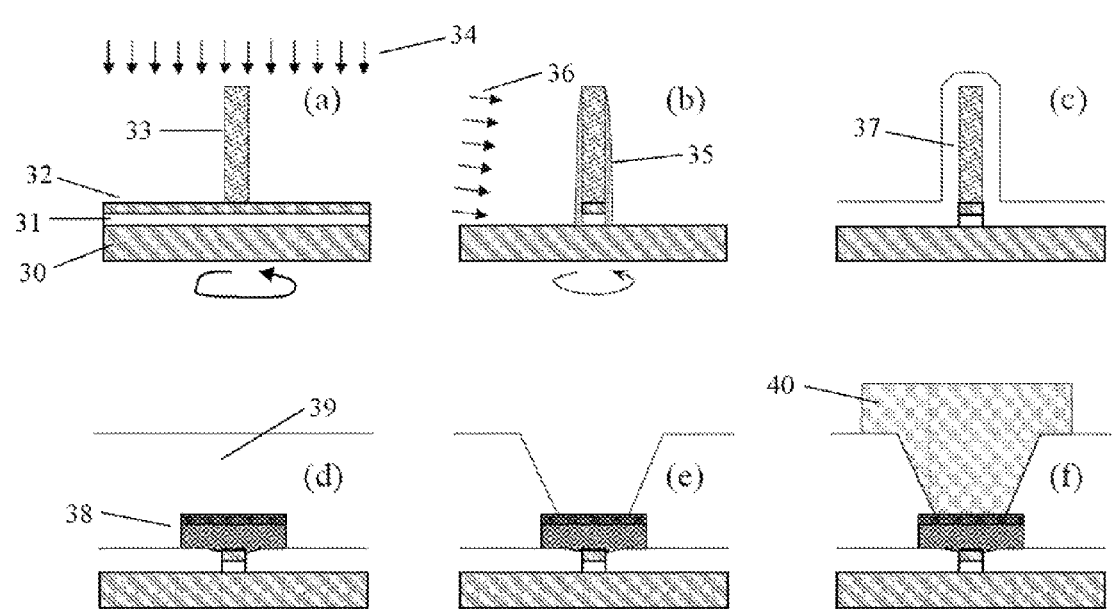
FIGS. 2(a)-(f) and 3 show a method for processing CPP device structures according to an exemplary embodiment of the present invention.

FIGS. 2(a)-(f) and 3 show a processing method according to an exemplary embodiment of the present invention. A substrate (not shown) may be covered with one or more layers 30-32. The substrate may be rotated to facilitate processing. These layers may comprise the CPP device structure and may include, for example, a fixed layer 30, a magnetic tunnel barrier layer 31 and a free layer 32, as described above in reference to FIG. 1. These layers, for example, layer 30 may include bottom wiring contacts. A mask pattern 33 for the current-perpendicular device structure may be formed on the layers 30-32 (Step S401) using for example a negative electron beam resist and electron beam lithography. Vertical or near-vertical ion milling 34 may then be used to transfer the e-beam negative resist pattern 33 onto the layers 30-32 (Step S402) as seen in FIG. 2(a). The vertical or near-vertical ion milling 34 may remove the portions of the layers 31 and 32 not covered by the e-beam negative resist pattern 33. In the illustrated example, the layer 30 may act as an etch stop. However, due to re-deposition and etching, material 35 may build up against the sides of the resist mask 33 as seen in FIG. 2(b). Next, ion milling may be applied at a grazing angle 36 to remove the re-deposition material 35 (Step S403). The appropriate grazing angle may be determined by trial-and-error and/or using the methods described in detail below. Vertical or near vertical angle ion milling and/or grazing angle ion milling may be applied multiple times, once for each layer of the current-perpendicular device structure (FIG. 1, 21-23). As each layer may be formed of a different material, a different grazing angle may be optimal. Accordingly, as discussed herein, it is to be understood that finding an optimal grazing angle and performing grazing angle ion milling may apply separately to each layer of the device structure. As seen in FIG. 2(c), a thin insulator 37, for example, having a thickness within the range of approximately 100 Å to 600 Å, may be applied to encapsulate the formed structure (Step S404). The thin insulator 37 may be an oxide layer. Encapsulation may be performed in-situ after sidewall cleaning. Encapsulation may be used to protect the formed structure from environmental elements. Lift-off may then be performed to remove the resist mask 33 and to expose the top of the device structure for top contact (Step S405). Lift-off may be carried out using a solvent to dissolve the mask. The solvent-based lift-off may be assisted by a mechanical polish, if necessary. The thinness of the thin insulator 37 may facilitate lift-off. Good and reliable insulator strength may be a particular concern where large areas of overlapping top and bottom electrodes are to be covered by an insulator. To resolve these concerns, an intermediate-level metal or otherwise conductive layer is formed over the first insulation layer and in electrical contact with the portion of the device structure exposed by the lift-off (Step S406). The intermediate-level metal layer is lithographically patterned (Step S407) to an island shape to form a conductive island structure that acts as a mesa-level contact (Step S408) such that the lateral dimension of the island structure is larger than the lateral dimension of the device structure.

As seen in FIG. 2(d), the conductive island structure (mesa-level) 33 may be used to limit the area-coverage requirements of the thin insulator 37. As a result of using the mesa-level, the thin insulator 37 only has to be thick enough to allow for etch-stop of the mesa-level metal. Moreover, the conductive island structure 38 need only cover an area large enough for accurate via opening as determined by the layer-to-layer registration accuracy of conventional optical lithography. The mesa-level metal may have a sheet resistance compatible with the junction resistance under consideration and can be finished with a noble metal, for example, platinum (Pt), or other conductors compatible with the etch-stop requirements for subsequent insulator opening. For example, the mesa-level may include a layer of copper of about 1000 Å covered by a layer of platinum of about 100 Å. Selecting a mesa-level metal with a sheet resistance compatible with the junction resistance under consideration may involve selecting a mesa-level metal that has a sheet resistance at least ten times smaller than the junction resistance. The entire structure may then be over-coated by a significantly thicker insulator layer 39 (Step 3409). The thick insulator layer 39 may form the main insulation separating the top and bottom wiring levels. The thick insulator 39 may then be patterned for via-opening using simple optical lithography, etch-stopping on the surface of the mesa-level metal 38 as seen in FIG. 2(e) (Step S410). Materials used in forming the mesa-level metal 38 and the thick insulator layer 39 and the chemicals used in the etching process may be selected in accordance with known fabrication processes and may be optimised, to improve yield. Top wiring 40 may then be formed and defined (Step S411 in FIG. 3) as seen in FIG. 2(f).

Grazing Angle Selection

As described above, in using grazing ion milling to clean-up re-deposited material from the side walls of the feature structure, a grazing angle may be selected that optimizes clean-up for the given feature chemistry and such factors as the apparatus being used. Conventionally, the optimum grazing angle is determined at great expense by a process of trial-and-error.

Exemplary embodiments of the present invention may be used to determine an appropriate grazing angle, along with other parameters, that may be the optimum grazing angle or a first-order approximation thereof. Where a first-order approximation is determined, this approximation may be used as a starting point for selecting a grazing angle and an optimum grazing angle may then be found by subsequent modification and trial.

Figure 4:
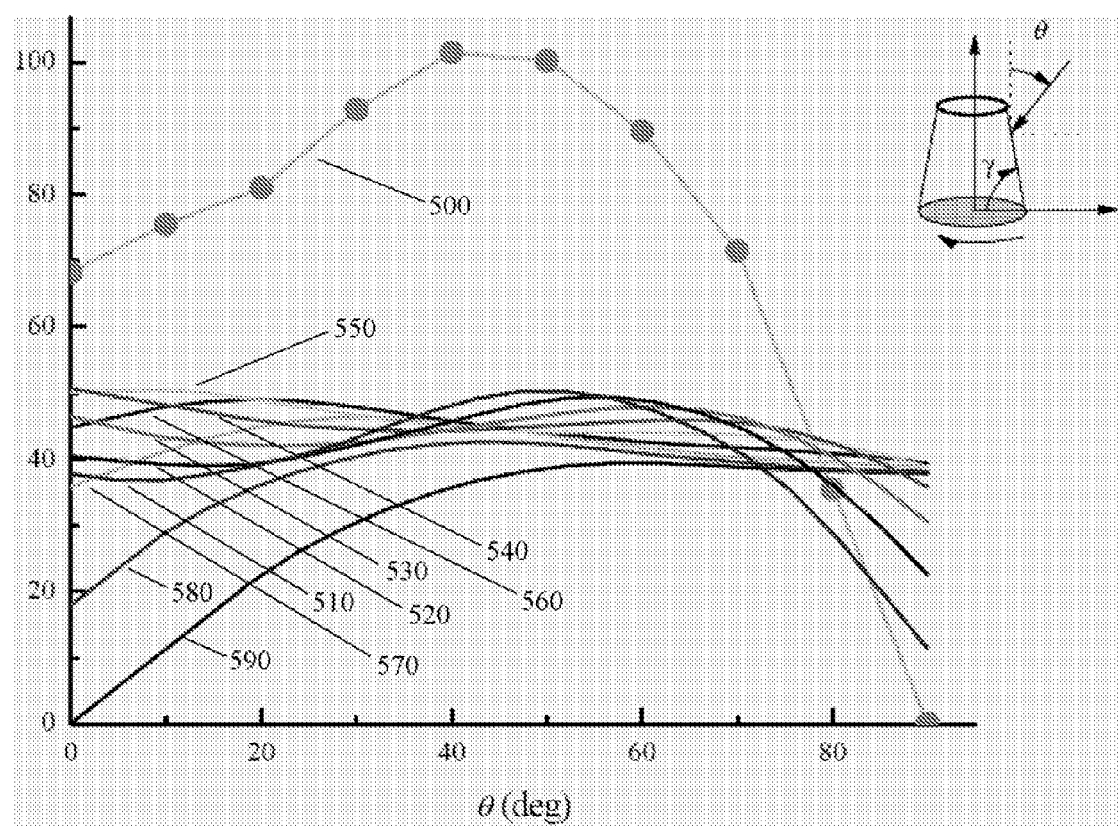
FIG. 4 shows angular dependence of ion milling rates according to an exemplary embodiment of the present invention.

The ion mill rate of a given material, for example, for a given layer of a device structure, may depend on the incident angle of the etching beam. Examples of measured angular dependent etch rates $I(\theta)$ are illustrated in FIG. 4. Here, the curve 500 represents a main angular dependent milling rate for thermally grown silicon dioxide milled using an argon (Ar) ion beam at 400 eV with an ion beam incident angle $\theta$, defined with respect to the normal plane of the silicon oxide film. The curve 510 represents the calculated average milling rate of the re-deposited material on the sidewall for a sidewall angle $\gamma=10°$. The curve 520 represents the calculated average milling rate of the re-deposited material on the sidewall for a sidewall angle $\beta=20°$. The curve 530 represents the calculated average milling rate of the re-deposited material on the sidewall for a sidewall angle $\gamma=30°$. The curve 540 represents the calculated average milling rate of the re-deposited material on the sidewall for a sidewall angle $\gamma=40°$. The curve 550 represents the calculated average milling rate of the re-deposited material on the sidewall for a sidewall angle $\gamma=50°$. The curve 560 represents the calculated average milling rate of the re-deposited material on the sidewall for a sidewall angle $\gamma=60°$. The curve 570 represents the calculated average milling rate of the re-deposited material on the sidewall for a sidewall angle $\gamma=70°$. The curve 580 represents the calculated average milling rate of the re-deposited material on the sidewall for a sidewall angle $\gamma=80°$. The curve 590 represents the calculated average milling rate of the re-deposited material on the sidewall for a sidewall angle $\gamma=90°$. The sample is assumed to rotate at an even speed around an axis perpendicular to the film surface. The rotation speed may be such that the time for completing one revolution is substantially shorter than the ion milling time required for sidewall cleanup.

It can foe seen from the example shown in FIG. 4 that for angle $\theta$ greater than 80°, ion milling is mainly directed to sidewall cleaning as opposed to vertical etching. However, for a given set of parameters, such as material selection and feature geometry, different angles may be optimal. Accordingly, embodiments of the present invention provide a general case for determining the appropriate angle or the first-order approximation thereof as a function of a unique set of parameters. The data shown in FIG. 4 is offered as an exemplary embodiment of the present invention under a particular exemplary set of parameters.

In representing the angular dependence of the ion mill rate, the unit vector can be written as $n_1=(\sin\theta)e_y+(\cos\theta)e_z$, where the unit vector normal to the pillar side-wall is $n=(\sin\gamma)(\cos\phi)e_x+(\sin\gamma)(\sin\phi)e_y+\cos\gamma e_z$, where $\phi$ is the rotation angle of the pillar. The angle formed between the ion beam and the pillar side-wall surface is therefore $\xi$ with $\cos\xi=n\cdot n_1=\cos\gamma\cos\theta+\sin\gamma\sin\phi\sin\theta$. For an ion mill with angular dependent etch rate represented as $I(\theta)$, the rotation angle-averaged milling rate on the device structure pillar side-wall surface is $$I_s(\gamma, \theta) = \langle I \rangle = \frac{1}{2} \frac{1}{(\pi/2)} \int_{\varphi=0}^{\pi/2} I[\cos^{-1}(\cos\gamma\cos\theta + \sin\gamma\sin\theta\sin\varphi)]d\varphi \quad (1)$$

This integral can be numerically carried out for any given experimentally obtained $I(\theta)$. A set of thus-calculated side-wall etch rate for $SiO_2$ at 10° intervals for the side-wall tapering angle is shown in FIG. 4.

Figure 3:
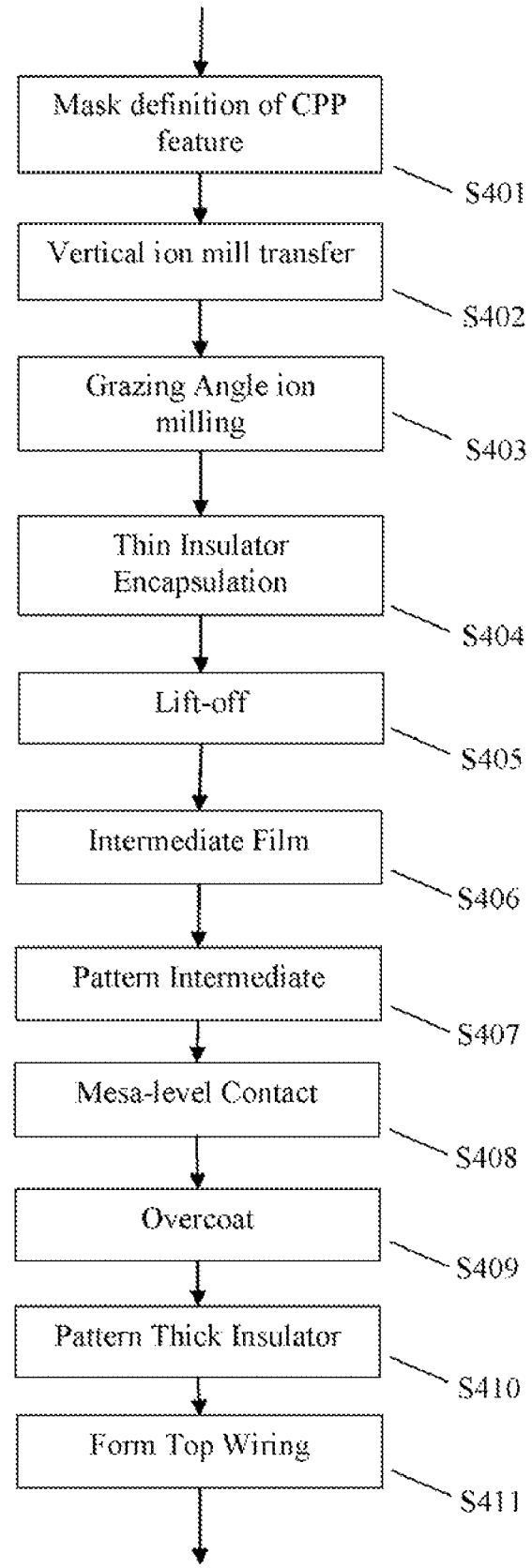

As seen from FIG. 4, for each side-wall tapering angle $\gamma$, there is a critical angle $\theta_c$ above which the average etch-rate of the side-wall becomes higher than that for the base planar film. For side-wall cleaning, it is desirable to operate in the region $\theta > \theta_o$ if it is desired that the ion beam is primarily to etch the side-wall of the pillar. From FIG. 4, it may foe seen that this would likely involve a grazing angle of $\theta > 80°$. The shape of $I(\theta)$ is a function of the material being etched as well as the ion beam energy used for etching. It may also have the ion beam angular divergence convoluted in, especially for the grazing angle region. Additional low-angle reflection of the primary etching ion beam, by near-by surfaces may further affect the actual local milling rate. A systematic study of these etching behavior may be necessary if one wants accurate control of the etch profile for a given materials set. But for initial exploration, it is a fairly safe assumption to use a grazing angle $\theta > 80°$ for side-wall cleaning (FIG. 3, Step S403).

Ion milling may be performed on a multilayer magnetic tunnel junction (MTJ) thin film stack. In the example seen in FIG. 4, the stack is defined accordingly, from the bottom up, with, the number representing thickness in Angstroms: ||50 Ta|200 CuN|30 Ta|200 CuN|150 PtMn|25 CoFe|8.5 Ru|30 CoFeB|4 Mg|8.5 MgO|25 CoFeB|50 TaN|70 Ru||. Thin film wafers are spun, with 190 nm thick negative electron beam resist (NEB) and exposed to form junction level patterns. Feature sizes range from 50×50 nm² to 70×210 nm². The pattern is transferred into the magnetic multilayers with 200 eV, $\theta=0$ perpendicular ion mill etching. Etch stopping occurs immediately past the MgO tunnel barrier, as monitored by a secondary ion mass spectrometer (SIMS). Etching is immediately followed by grazing-angle ion mill cleaning at $\theta = 85°$ for twice the time required to etch stop at the MgO tunnel barrier.

The ion beam energy used for grazing angle clean up may foe set such that the energy is not so high as to cause substantial damage below the surface of the etching but not so low as to degrade the ion source beam divergence angle. This practical limit may foe around 150 eV to 200 eV depending on the detailed configurations of the etching tool being used.

Milled samples are coated in situ with 200 Å of $AlO_x$, followed by a further coating of 250 Å of $SiO_x$. Both coatings may be applied, for example, using sputtering deposition. The thickness of the oxide may be chosen such that it is thick enough for reliable ion mill end-point stop during the subsequent definition of mesa-level metal etch, and thin enough to allow for easy lift-off of the pillar with minimal surface mechanical polish.

Samples are then processed for solvent-based lift-off. Gentle mechanical polish at the film surface may be used to assist lift-off as needed. Prior to lift-off, resist pillars may be coated with $SiO_2$. A top metal surface may foe exposed for mesa-level contact metal deposition after the resist pillar and $SiO_2$ are lifted off. An additional oxygen plasma ashing step may be performed, as needed, after the solvent-based lift-off to clean up any organic residuals atop the pillar, providing a clean surface for mesa-level metal deposition, which may be subsequently performed using magnetron sputter deposition.

A protective layer of approximately 100 Å of platinum, or the like, may be used as a protective junction stack top. Such a protective surface may allow for more aggressive cleaning of the junction top surface.

Solvent-based lift-off may be made feasible by the use of the thin insulator layer. The effective removal of side-wall coating with grazing angle ion mill may allow for clean lift-off without residual side-wall features surrounding the mask. Without the use of grazing angle clean up, residual side-walls surrounding the mask may foe observed. Residual side-walls could be removed by forceful means such as $CO_2$ snow-jet cleaning. However, for magnetic thin film stacks, interface adhesion between layers may be quite weak, and snow-jet cleaning may degrade or destroy the junction structure under fabrication.

Figure 5:
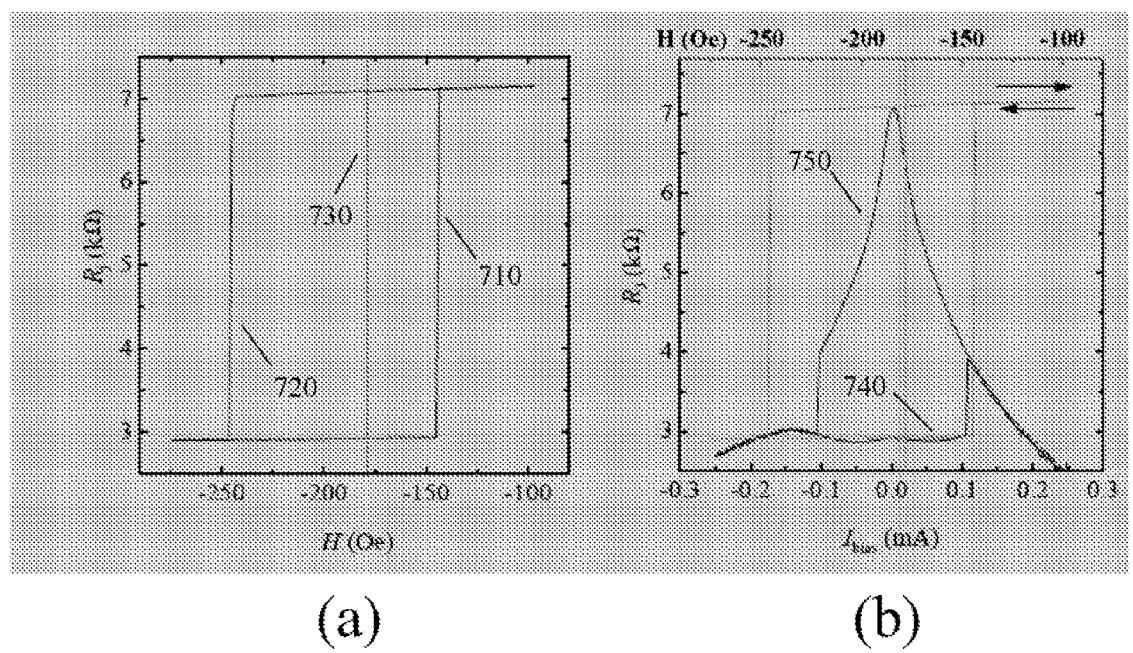
FIG. 5 shows transport characteristics of the magnetoresistance (MR) and spin-current-induced magnetic switching that can be seen from an MTJ fabricated according to an exemplary embodiment of the present invention.

Attention may be paid to ensuring proper compatibility between the chosen mesa-level metal surface and the subsequent thick insulator via opening etch. The mesa-level metal may be comprised of a film of approximately 1,000 Å copper capped with approximately 100 Å of platinum. The platinum top finish may provide resilience to subsequent reactive etching chemistry used in $SiO_x$ opening. Experimental implementations of the above-described approach have demonstrated reliable yields, consistent magnetic tunnel characteristics and spin-current induced magnetic switching, as can be seen in FIG. 5. Here, transport characteristics of the magnetoresistance (MR) and spin-current-induced magnetic switching can be seen from an MTJ fabricated according to an exemplary embodiment of the present invention.

FIG. 5(a) shows the resistance R as a function of a field H, a hysteresis loop of an MTJ. Here the MTJ is seen to magnetically switch under the influence of an applied magnetic field of approximately −160 Oe when the field is sweeping up 710, and approximately −240 Oe when the field is sweeping down 720. The vertical line 730 represents a field value of −178.8 Oe which is the static bias field at which the current induced magnetic switching, as shown in FIG. 5(b), is performed. In FIG. 5(b), the junction's resistance is shown to be switched by the application of a bias current through the junction device. The two half-branches corresponding to R(I) when current I is sweeping up 740, and sweeping down 750, respectively. The R(H) hysteresis loop shown in FIG. 5(a) is reproduced here. The exact overlap of the resistance values of the two branches of R(I) at I=0 with the R(H) curves indicate the junction switching upon current biasing is of the identical magnitude as the switching induced by magnetic field. Here the junction is composed of a MgO-barrier-based magnetic tunnel junction, with approximately 2.5 nm of CoFeB as the switching ferromagnetic electrode. The lateral dimensions of the MTJ are approximately 50 nm by 100 nm. The measurements are performed at ambient temperature. The magnetic field is applied in-plane, along the geometric easy-axis of the junction device, and the junction resistance shown is its dynamic resistance dV/dI measured using lock-in detection of a 1 uA root-mean-square ac current super-imposed on the dc-bias value.

Accordingly, the desired grazing angle, or first-order approximation thereof, may be dependent upon a determination of where the rotation angle-averaged milling rate $I_s(\gamma,\theta)$ as defined by equation 1, is larger than the etch rate represented as $I(\theta)$, which is a function of the material being etched as well as the ion beam energy used for etching. Upon deriving a first-order approximation, further optimization may be performed by trial.

Moreover, a grazing angle so-selected may be applied to the above-described lithography process shown in FIGS. 2(a)-(f) and 3, for example, in the step S403 of FIG. 3.

The above specific embodiments are illustrative, and many variations can be introduced on these embodiments without departing from the spirit of the disclosure or from the scope of the appended claims. For example, elements and/or features of different illustrative embodiments may be combined with each other and/or substituted for each other within the scope of this disclosure and appended claims.

The invention claimed is:

1. A method for fabricating a device, comprising:
   forming a removable mask on a surface of a thin-film stack;
   performing vertical or near-vertical ion milling to form a device structure out of the thin-film stack that is in a pattern of the removable mask;
   performing grazing-angle ion milling at one or more predetermined grazing angles to remove re-deposition material left during the vertical or near-vertical ion milling;
   forming a first insulation layer covering the removable mask and the device structure; and
   lifting off the removable mask to expose a top portion of the device structure through a hole in the first insulation layer, said hole having a feature size in the sub-65 nm range,
   wherein the grazing-angle ion milling is performed multiple times, once for each layer of the thin-film stack that is in the pattern of the removable mask and for each instance of grazing-angle ion milling, a different grazing angle is used.

2. The method of claim 1, additionally comprising:
   forming a conductive island structure over the first insulation layer and the exposed top portion of the device structure;
   coating the first insulation layer and the conductive island structure with a second insulation layer; and
   forming a contact through the second insulation layer to the conductive island structure.

3. The method of claim 2, wherein the step of forming the conductive island structure comprises:
   forming an intermediate-level metal layer over the first insulation layer, the intermediate-level layer being in electrical contact with the exposed top portion of the device structure; and
   lithographically patterning the intermediate-level metal layer to form the conductive island structure on top of the device structure, wherein a lateral dimension of the conductive island structure is larger than a lateral dimension of the device structure.

4. The method of claim 2, wherein the step of forming a contact through the second insulation layer to the conductive island structure comprises patterning the second insulation layer to expose a portion of the conductive island structure.

5. The method of claim 2, wherein the conductive island structure comprises of a layer of copper about 1000 Å thick and a layer of platinum about 100 Å thick over the copper layer.

6. The method of claim 1, wherein the one or more predetermined grazing angles are selected using trial-and-error.

7. The method of claim 1, wherein the one or more predetermined grazing angles are selected by determining when a rotation angle-averaged milling rate of the re-deposition material is larger than an ion milling rate of the thin film stack for the given grazing angle.

8. The method of claim 1, wherein the layers of the thin film stack comprise a magnetically fixed layer, a tunnel barrier layer, and a magnetically free layer.

9. The method of claim 1, wherein the layers of the thin film stack comprise a magnetically fixed layer, a nonmagnetic conducting layer, and a magnetically free layer.

10. The method of claim 1, wherein the first insulation layer has a thickness within the range of about 100 Å to about 600 Å.

11. The method of claim 1, wherein the grazing angle ion milling is performed for each layer of the device structure at a corresponding grazing angle, wherein the corresponding grazing angle is dependent upon a composition of the corresponding layer.

12. The method of claim 11, wherein each corresponding grazing angle is selected by determining when a rotation angle-averaged milling rate of a sidewall of the device structure for the grazing angle ion milling at a given grazing angle is larger than an ion milling rate of the thin film stack for the given grazing angle.

13. A method for fabricating a device, comprising:
   forming a removable mask on a surface of a thin-film stack;
   performing vertical or near-vertical ion milling to form a device structure out of the thin-film stack that is in a pattern of the removable mask;
   performing grazing-angle ion milling at one or more predetermined grazing angles to remove re-deposition material left during the vertical or near-vertical ion milling;
   forming a first insulation layer covering the removable mask and the device structure; and
   lifting off the removable mask to expose a top portion of the device structure through a hole in the first insulation layer, said hole having a feature size in the sub-65 nm range,
   wherein the one or more predetermined grazing angles are selected by determining when a rotation angle-averaged milling rate of the re-deposition material is larger than an ion milling rate of the thin film stack for the given grazing angle, and
   wherein the rotation angle-averaged milling rate of the sidewall of the device structure for the grazing angle ion milling, $I_s(\gamma,\theta)$, is determined according to the equation:

$$I_s(\gamma,\theta) = \langle I \rangle \tfrac{1}{2} 1/(\pi/2) \int_{\phi=0}^{\pi/2} I[\cos^{-1}(\cos\gamma\cos\theta + \sin\gamma\sin\theta\sin\phi)]d\phi$$

where $\gamma$ is a sidewall tapering angle of the device structure, $\phi$ is the rotation angle of the device structure, $\theta$ is the incident angle of an etching beam, and $I(\theta)$ is an angular dependence of an ion milling rate of the thin film stack.

14. A method for removing material from a sidewall of a device structure, the material having been re-deposited during vertical or near-vertical ion milling, the method comprising performing gazing angle ion milling at one or more a grazing angles wherein the grazing angles are selected by determining when a rotation angle-averaged milling rate of the re-deposited material is larger than an ion milling rate of a thin film stack of the device structure for the given grazing angle, wherein the rotation angle-averaged milling rate for the grazing angle ion milling, $I_s(\gamma,\theta)$, is determined according to the equation:

$$I_s(\gamma,\theta) = \langle I \rangle \tfrac{1}{2} 1/(\pi/2) \int_{\phi=0}^{\pi/2} I[\cos^{-1}(\cos\gamma\cos\theta + \sin\gamma\sin\theta\sin\phi)]d\phi$$

where $\gamma$ is a sidewall tapering angle of the device structure, $\phi$ is the rotation angle of the device structure, $\theta$ is the incident angle of an etching beam, and $I(\theta)$ is an angular dependence of an ion milling rate of the thin film stack.

15. The method of claim 14, wherein a first-order approximation for the grazing angle is selected by determining an angle at which a rotation angle-averaged ion milling rate is larger than an ion milling rate of the thin film stack for a given grazing angle and the grazing angle is selected by trial-and-error using the first-order approximation for the grazing angle.

16. A method for fabricating a device, comprising:
- forming a removable mask on a surface of a thin-film stack;
- performing vertical or near-vertical ion milling to form a device structure out of the thin-film stack that is in a pattern of the removable mask;
- performing grazing-angle ion milling at one or more predetermined grazing angles to remove re-deposition material left during the vertical or near-vertical ion milling;
- forming a first insulation layer covering the removable mask and the device structure; and
- lifting off the removable mask to expose a top portion of the device structure through the first insulation layer,
- wherein the grazing-angle ion milling is performed multiple times, once for each layer of the thin-film stack that is in the pattern of the removable mask and for each instance of grazing-angle ion milling, a different grazing angle is used wherein the one or more predetermined grazing angles are selected by determining when a rotation angle-averaged milling rate of the re-deposition material is larger than an ion milling rate of the thin film stack for the given grazing angle.

17. The method of claim 16, wherein the one or more predetermined grazing angles are selected using trial-and-error.

18. The method of claim 16, wherein the rotation angle-averaged milling rate of the sidewall of the device structure for the grazing angle ion milling, $I_s(\gamma,\theta)$, is determined according to the equation:

$$I_s(\gamma,\theta) = \langle I \rangle \tfrac{1}{2} 1/(\pi/2) \int_{\phi=0}^{\pi/2} I[\cos^{-1}(\cos\gamma\cos\theta + \sin\gamma\sin\theta\sin\phi)] d\phi$$

where $\gamma$ is a sidewall tapering angle of the device structure, $\phi$ is the rotation angle of the device structure, $\theta$ is the incident angle of an etching beam, and $I(\theta)$ is an angular dependence of an ion milling rate of the thin film stack.

\* \* \* \* \*